United States Patent
Francis et al.

(10) Patent No.: US 7,696,540 B2
(45) Date of Patent: Apr. 13, 2010

(54) STRUCTURE AND METHOD FOR A FAST RECOVERY RECTIFIER STRUCTURE

(75) Inventors: Richard Francis, Los Gatos, CA (US); Yang Yu Fan, Sunnyvale, CA (US); Eric Johnson, Santa Clara, CA (US); Hy Hoang, Santa Clara, CA (US)

(73) Assignee: Qspeed Semiconductor Inc., Santa Clara, CA (US)

( * ) Notice: Subject to any disclaimer, the term of this patent is extended or adjusted under 35 U.S.C. 154(b) by 92 days.

(21) Appl. No.: 11/644,578

(22) Filed: Dec. 22, 2006

(65) Prior Publication Data
US 2007/0145429 A1 Jun. 28, 2007

Related U.S. Application Data

(60) Provisional application No. 60/754,550, filed on Dec. 27, 2005.

(51) Int. Cl.
*H01L 29/80* (2006.01)
(52) U.S. Cl. .................................. 257/260; 257/263
(58) Field of Classification Search .............. 257/260, 257/263
See application file for complete search history.

(56) References Cited

U.S. PATENT DOCUMENTS

| | | | | |
|---|---|---|---|---|
| H40 | H | 4/1986 | Buchanan et al. | 257/484 |
| 4,707,719 | A | 11/1987 | Whight | 257/489 |
| 4,982,260 | A | 1/1991 | Chang et al. | 357/38 |
| 5,371,400 | A | 12/1994 | Sakurai | 257/478 |
| 5,612,567 | A | 3/1997 | Baliga | 257/475 |
| 6,184,545 | B1 | 2/2001 | Werner et al. | 257/109 |

(Continued)

FOREIGN PATENT DOCUMENTS

DE 10350160 A1 9/2005

(Continued)

OTHER PUBLICATIONS

Baliga, B.J., "Analysis of a High Voltage Merged PIN/Schottky (MPS) Rectifier," IEEE Electron Device Letters, vol. EDL-5, 1987, pp. 407-409.

(Continued)

*Primary Examiner*—Phat X Cao
(74) *Attorney, Agent, or Firm*—Morgan, Lewis & Bockius LLP (57) ABSTRACT

An apparatus and method for a fast recovery rectifier structure. Specifically, the structure includes a substrate of a first dopant. A first epitaxial layer lightly doped with the first dopant is coupled to the substrate. A first metallization layer is coupled to the first epitaxial layer. A plurality of trenches is recessed into the first epitaxial layer, each of which is coupled to the metallization layer. The device also includes a plurality of wells each doped with a second dopant type, wherein each well is formed beneath and adjacent to a corresponding trench. A plurality of oxide layers is formed on walls and a bottom of a corresponding trench. A plurality of channel regions doped with the first dopant is formed within the first epitaxial layer between two corresponding wells. Each of the plurality of channel regions is more highly doped with the first dopant than the first epitaxial layer.

17 Claims, 5 Drawing Sheets

U.S. PATENT DOCUMENTS

| | | |
|---|---|---|
| 6,221,688 B1 | 4/2001 | Fujihira et al. ............... 438/92 |
| 6,252,288 B1 | 6/2001 | Chang ...................... 257/471 |
| 6,307,244 B1 | 10/2001 | Shikata ..................... 257/471 |
| 6,380,569 B1* | 4/2002 | Chang et al. ............... 257/256 |
| 6,501,146 B1 | 12/2002 | Harada ...................... 257/475 |
| 6,603,153 B2 | 8/2003 | Francis et al. .............. 257/104 |
| 6,707,127 B1 | 3/2004 | Hshieh et al. ............... 257/483 |
| 6,710,418 B1 | 3/2004 | Sapp ........................ 257/471 |
| 6,768,138 B1 | 7/2004 | Kitada et al. ............... 257/127 |
| 6,897,133 B2 | 5/2005 | Collard ..................... 438/570 |
| 7,101,739 B2 | 9/2006 | Lanois ...................... 438/141 |
| 7,199,442 B2* | 4/2007 | Shenoy ...................... 257/471 |
| 7,211,845 B1* | 5/2007 | Yu et al. .................... 257/263 |
| 2002/0008246 A1 | 1/2002 | Francis et al. .............. 257/104 |
| 2002/0125541 A1 | 9/2002 | Korec et al. ................ 257/471 |
| 2002/0190338 A1 | 12/2002 | Skocki ...................... 257/471 |
| 2003/0006472 A1 | 1/2003 | Buchanan et al. ........... 257/475 |
| 2003/0020134 A1 | 1/2003 | Werner et al. ............... 257/471 |
| 2003/0096464 A1 | 5/2003 | Lanois ...................... 438/173 |
| 2003/0160262 A1 | 8/2003 | Kitada et al. ............... 257/127 |
| 2003/0218230 A1 | 11/2003 | Takahashi et al. ........... 257/471 |
| 2004/0046224 A1 | 3/2004 | Rossel et al. ............... 257/471 |
| 2004/0110330 A1 | 6/2004 | Collard ..................... 438/167 |
| 2005/0029614 A1 | 2/2005 | Wu .......................... 257/471 |
| 2005/0073030 A1 | 4/2005 | Inoue et al. ................ 257/656 |
| 2005/0230744 A1* | 10/2005 | Wu .......................... 257/330 |
| 2005/0242411 A1 | 11/2005 | Tso ......................... 257/480 |
| 2006/0226504 A1 | 10/2006 | Hatakeyama et al. ....... 257/472 |

FOREIGN PATENT DOCUMENTS

| | | |
|---|---|---|
| EP | 0975024 A2 | 1/2000 |
| WO | WO 01/11693 A1 | 2/2001 |
| WO | WO 02/09174 A1 | 1/2002 |

OTHER PUBLICATIONS

Baliga, B.J., "Power Semiconductor Devices—Chapter 4," PWS Publishing Company, 1996.

Gupta, R.N., et al., A Planarized High Voltage Silicon Trench Sidewall Oxide-Merged PIN/Schottky (TSOX-MPS) Rectified, IEEE, IEDM, 1999.

Yano, K., et al., "High Voltage Rectifier Using the BSIT Operation," IEEE Transactions on Electron Devices, vol. 45, No. 2, Feb. 1988.

International Search Report for International Application No. PCT/US2006/049118, mailed Apr. 7, 2007.

Irokawa, Y., et al., Si+ ion implanted MPS bulk GaN diodes, Solid-State Electronics, 48, pp. 827-830.

International Search Report for International Application No. PCT/US2006/048986, mailed Jul. 5, 2007.

Chang, H.R., et al., "1200V, 50A Trench Oxide PiN Schottky (TOPS) Diode," 34th Industry Applications Annual Meeting, Phoenix, Arizona, Oct. 3-7, 1999, pp. 353-358.

Office Action dated Aug. 14, 2009, issued in Chinese Patent Application No. 200680051344.9, which corresponds to U.S. Appl. No. 11/644,578.

* cited by examiner

STRUCTURE AND METHOD FOR A FAST RECOVERY RECTIFIER STRUCTURE

CROSS REFERENCE TO RELATED APPLICATIONS

This application claims priority to the provisional patent application, Ser. No. 60/754,550, entitled "Fast Recovery Rectifier Structure," filed Dec. 27, 2005, and assigned to the assignee of the present invention, which is herein incorporated by reference in its entirety.

This application is related to co-pending, commonly owned U.S. patent application, Ser. No. 10/869,718, entitled "Schottky Barrier Rectifier and Method of Manufacturing the Same," filed Jun. 15, 2004, which is hereby incorporated by reference herein in its entirety.

This application is related to co-pending, commonly owned U.S. patent application, Ser. No. 11/320,313, entitled "Ultrafast Recovery Diode," filed Dec. 27, 2005, which is hereby incorporated by reference herein in its entirety.

BACKGROUND OF THE INVENTION

1. Field of the Invention

Embodiments of the present invention relate to the field of rectifiers. More particularly, embodiments of the present invention relate generally to a fast recovery rectifier structure.

2. Related Art

An important factor in the efficiency of a switching power supply is the performance of the diodes used in such circuits. More particularly, the reverse recovery of such diodes can reduce turn-on loss of the transistor switch in such power supplies. For example, a reverse recovery current transient appears as an additional component of current during the turn-on of the switch, with the result that the turn-on loss of the switch is significantly higher that it would otherwise be without such reverse recovery component. Consequently, reducing diode reverse recovery charge (Qrr) is important for improving the efficiency of switching power supplies.

Unfortunately, however, if the reverse recovery is too abrupt, then the current and voltage will experience undesirable oscillations. Such oscillations can result in, for example, low efficiency power supply operation, a deleteriously noisy output (e.g., power supply ripple and/or electromagnetic interference), and/or extremely high and possibly damaging voltage spikes.

SUMMARY OF THE INVENTION

Thus, a fast recovery rectifier structure with reduced reverse recovery charge that maintains a soft recovery characteristic is highly desired. A further desire exists to meet the previously identified desire in a fast recovery rectifier structure that is formed using a trench for smaller geometries. Yet another desire exists to meet the previously identified desires in a manner that this compatible and complimentary with conventional semiconductor manufacturing processes and equipment.

Accordingly, various embodiments of the present invention disclose an apparatus and method for a fast recovery rectifier structure. Embodiments of the present invention are able to reduce the reverse recovery charge while maintaining a soft recovery characteristic. Also, embodiments of the present invention disclose a silicon based fast recovery rectifier structure involving the creation of Schottky diode regions in series with JFET channel regions, or a merged PiN Schottky (MPS) diode structure. The MPS diode structure enables a higher Schottky to PiN ratio because of smaller geometries, and reduced channel resistance due to N doping between the well regions that reduce the contribution of hole injection during forward conduction, for example in one embodiment.

Specifically, the rectifier structure includes a substrate of a first dopant type. A first epitaxial layer lightly doped with said first dopant type is coupled to the substrate. A first metallization layer is coupled adjacent to the first epitaxial layer. A plurality of trenches is recessed into the first epitaxial layer, each of which is coupled to the metallization layer. The device also includes a plurality of wells each doped with a second dopant type, each of which is separated from one another, and wherein each of which is formed beneath and adjacent to a corresponding trench in the plurality of trenches. A plurality of oxide layers is formed on walls and a bottom of a corresponding trench such that a corresponding well is electrically isolated from the corresponding trench. A plurality of channel regions doped with said first dopant type is formed within the first epitaxial layer between two corresponding wells from the plurality of wells, and wherein each of the plurality of channel regions is more highly doped with the first dopant type than the first epitaxial layer.

Embodiments of the present invention also describe a method for forming fast recovery rectifier structures. The method includes depositing a second epitaxial layer doped with a first dopant type upon a substrate. The substrate is highly doped with the first dopant type. That is, the substrate is more highly doped than the second epitaxial layer. The method also deposits a first epitaxial layer lightly doped with the first dopant type on the second epitaxial layer. The second epitaxial layer is more highly doped than the first epitaxial layer. A plurality of trenches is etched into the first epitaxial layer. A plurality of oxide, gate definition spacers is formed on walls and bottoms of each of the plurality of trenches. A plurality of wells is implanted proximate a bottom of each of the plurality of trenches. Each of the plurality of wells is doped with a second dopant type, and is separated from one another. That is, each of the plurality of wells is electrically isolated from a corresponding trench. A first metallization layer is deposited upon the epitaxial layer.

DETAILED DESCRIPTION OF THE INVENTION

Reference will now be made in detail to the preferred embodiments of the present invention, a fast recovery rectifier structure and a method for fabricating the structure, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

For purposes of clarity and understanding, embodiments of the present invention are described as rectifiers having p-wells in an n-type substrate. However, it is to be appreciated that other embodiments of the present invention are well suited to constructions utilizing materials of opposite polarity to those depicted herein, for example, a rectifier with n-wells in a p-substrate. Such alternative embodiments are to be considered within the scope of the present invention.

Figure 1:
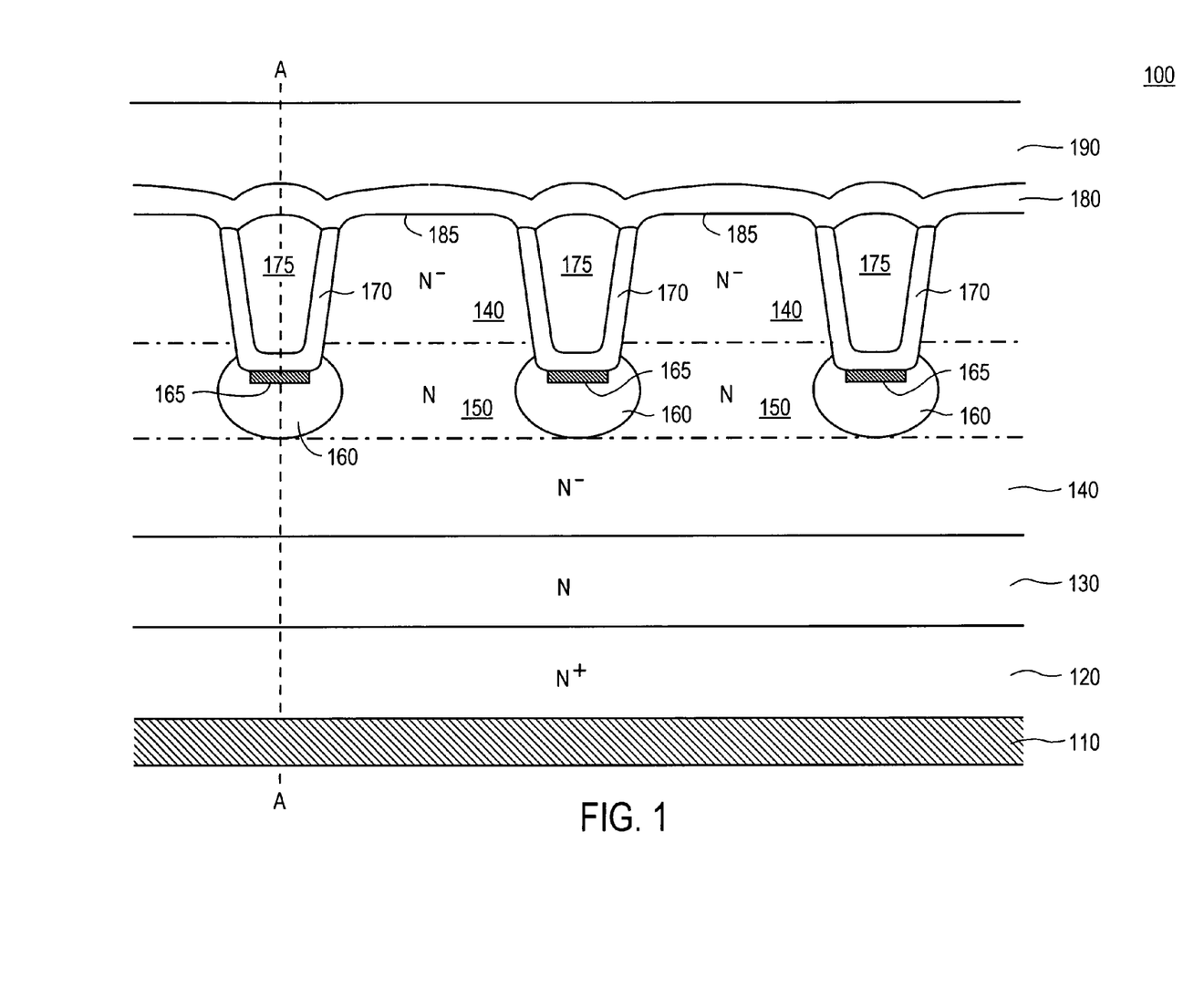
FIG. 1 illustrates a side sectional view of an ultrafast recovery diode, in accordance with one embodiment of the present invention.

FIG. 1 is a side sectional view of a fast recovery rectifier device 100, in accordance with one embodiment of the present invention. As shown in FIG. 1, the rectifier device 100 can be repeated in a semiconductor substrate to complete one or more rectifier devices 100. The rectifier includes a first metallization layer 190 and a second metallization layer 110. For example, the first metallization layer 190 acts as an anode, and the second metallization layer 110 acts as a cathode. The rectifier structure as described in FIG. 1 is capable of creating devices with rated breakdown voltages from 150 to 1200 volts.

The rectifier device 100 includes a heavily doped substrate 120 that is doped with a first dopant type. In one embodiment, as shown in FIG. 1, the first dopant type is an n-type dopant. As such, the substrate 120 is doped to an $n^+$, concentration.

In one embodiment, the second metallization layer is disposed adjacent to the substrate 120. That is, the cathode metallization of the rectifier 100 is coupled to the $n^+$ substrate, as shown in FIG. 1.

Disposed on top of the $n^+$ substrate 120 is a first epitaxial layer 140 that is epitaxially deposited and lightly doped with the first dopant type, such as n-type. That is, the dopant concentration of the $n^-$ first epitaxial layer, or $n^-$ drift region, is less than the dopant concentration of the $n^+$ substrate 120. In addition, the first epitaxial layer 140 is coupled to the substrate in one embodiment.

In one embodiment, the first metallization layer 190 is disposed adjacent to the first epitaxial layer 140. The first metallization layer typically comprises aluminum, and may further comprise about one percent silicon, in some embodiments. That is, in one embodiment, the first metallization layer 190 comprises a single layer of aluminum doped with silicon. In another embodiment the first metallization layer 190 comprises a composite layer of aluminum doped with silicon.

Disposed between the $n^+$ substrate 120 and the first epitaxial layer 140 is a second epitaxial layer 130 doped with the first dopant type, such as n-type. The dopant concentration of the n-type second epitaxial layer 130 is less than the dopant concentration of the $n^+$ substrate 120. Also, the dopant concentration of the n-type second epitaxial layer 130 is higher than the dopant concentration of the $n^+$ first epitaxial layer 140.

In the dual epitaxial layer structure of the rectifier 100, the second epitaxial layer 130 acts as a depletion layer stop. That is, in the second epitaxial layer 130, the electric field is able to reduce to zero before reaching the $n^+$ substrate 120. As a result, with the addition of the second epitaxial layer 130, the first epitaxial layer 140 can be made thinner.

The rectifier structure 100 includes a plurality of trenches 175, each of which is recessed into the first epitaxial layer 140. In addition, each of the plurality of trenches 175 is electrically coupled to the first metallization layer 190 (not shown). In one embodiment, each of the plurality of trenches is filled with undoped silicon or undoped polysilicon.

In one embodiment, the trenches 175 have exemplary depth dimensions of about 300 to 700 nanometers. In addition, the trenches 175 have exemplary width dimensions of about 0.4 to 0.5 μm. It is appreciated that embodiments in accordance with the present invention are well suited to other dimensions.

At the bottom of the plurality of trenches 175 is a plurality of wells 160. That is, at the bottom of each of the plurality of trenches 175 is a shallow well 160. As such, each of the plurality of wells 160 is formed beneath and adjacent to a corresponding trench 175 in the plurality trenches 175. Each of the plurality of wells is doped with a second dopant type, such as p-type dopant. As shown in FIG. 1, each of the plurality of p-wells 160 is separated from one another.

In one embodiment, the p-well 160 is doped with boron atoms. For instance, the concentration of boron in this region is about $1 \times 10^{18}$ atoms per cubic centimeter. In addition, in another embodiment the junction depth of the p-well is approximately 0.2-0.3 μm. Also, the dimension for the p-well window is approximately 150 to 200 nanometers.

In one embodiment of the present invention, minority carrier lifetime killing techniques are implemented to reduce the time for the carrier to recombine during reverse recovery of the rectifier structure 100.

Also shown in FIG. 1, the rectifier 100 includes a plurality of oxide layers 170. Each of the plurality of oxide layers 170 is formed on the walls and a bottom of a corresponding trench. For instance, each of the trenches 175 is covered with an insulating film of silicon dioxide 170, in one embodiment. The remaining portion of the trench 175 is filled with undoped polysilicon, in one embodiment.

As such, each of the wells 160 is electrically isolated from the corresponding trench 175 by the oxide layer 170. That is, the first metallization layer 190 is electrically coupled to the undoped, polysilicon filled trenches 175. However, the first metallization layer 190 is not, electrically coupled to the p-well 160 through the trench region 175. That is, the insulating silicon dioxide oxide layer 170 at the bottom and vertical sides of the trench 175 acts to electrically isolate the p-well 160 form the first metallization layer 190 through the trench 175. However, the wells 160 are electrically coupled to the first metallization layer 190 through remotely located contact regions (not shown), described below in FIGS. 2 and 3.

As shown in FIG. 1, a plurality of channel regions 150 is formed between each of the wells 160. That is, regions between wells 160 is doped with the first dopant type (e.g., n-type dopant), and formed within the first epitaxial layer 140. That is, each channel region 150 is located between two corresponding wells 160. The dopant concentration of the channel region 150 is higher than the dopant concentration of the first epitaxial layer 140.

In accordance with embodiments of the present invention, regions 150 between p-wells 160 comprise n-type doping, and are referred to as "n-channel enhancement" layer 150. N-channel enhancement 150 comprises exemplary doping of about $1.0 \times 10^{15}$ to $2.0 \times 10^{16}$ atoms per cubic centimeter. In one embodiment, the channel region 150 is doped with phosphorous. It is appreciated that such a doping level is generally above a doping level of the n⁻ first epitaxial layer 140.

The rectifier structure 100 also includes a conductive titanium silicide ($TiSi_2$) layer 165 that is disposed on each of the surfaces of the plurality of wells 160. For instance, the titanium silicide layer 165 is created on the surface of the p-well 160 to reduce the lateral resistance of the p-well 160.

A Schottky barrier metal 180 is shown in rectifier 100 disposed under the first metallization layer 190. The Schottky barrier metal 180 separates the first metallization layer 190 and the first epitaxial layer 140, and the trenches 175. The Schottky barrier metal 180 comprises a barrier metal, such as molybdenum, tungsten, or platinum that is in intimate contact with the first epitaxial layer 140, the oxide layer 170 and the polysilicon regions in the trench 175.

A Schottky barrier 185 is formed between the anode metal 190 and the n⁻ epitaxial layer 140 in the mesa regions of the n⁻ first epitaxial layer 140. The mesa regions of the n⁻ first epitaxial layer 140 are formed between the trenches 175. In one embodiment, the mesa regions have dimensions of approximately 0.45 to 0.65 μm. In addition, the Schottky barrier 185 may be formed, for example, by inherent characteristics of aluminum disposes adjacent to an n⁻ epitaxial layer (e.g., anode metal 190 comprising aluminum disposed adjacent to n⁻ epitaxial layer 140).

It is appreciated that, under reverse bias conditions, Schottky diodes generally tend to leak. However, in accordance with embodiments of the present invention, under reverse bias, the p-wells 160 pinch off (e.g., a depletion regions forms between the p-wells 160), which ensures a desirable breakdown voltage and low leakage for the rectifier 100. Advantageously, the n-channel characteristics of the rectifier structure 100 results in improved reverse recovery. One mechanism for such improved reverse recovery is due to the suppression of minority carrier injection from the p-wells 160.

The rectifier 100 is understood as comprising one or more Schottky diodes, each of which is in series with a junction field effect transistor (JFET) channel, and the base region of a P intrinsic N (PiN) diode, in accordance with one embodiment of the present invention. That is, a p-well 160, an n⁻ first epitaxial layer 140, and an n⁺ substrate form a PiN diode, and between each PiN diode is a Schottky diode. The PiN diode is conductively modulated by the injection of minority carriers from the gate of the JFET.

The rectifier structure 100 is constructed utilizing relatively fine process geometries. In the present embodiment, the rectifier structure 100 exhibits dimensions of Schottky barrier 185 to PiN area in a ratio of greater than or equal to one. In particular, geometries described before for the rectifier structure 100 include n⁻ mesa regions of approximately 0.45 to 0.65 μm, a trench width region of approximately 0.4 to 0.5 μm, a trench depth of approximately 300 to 700 nm, a dimension of p-well window of approximately 150 to 200 mn, and a depth of p-well of approximately 0.2 to 0.3 μm. These geometries give a Schottky to PiN ratio of greater than one.

Due to the high Schottky to PiN ratio of the rectifier 100, and the n-channel region 150, the rectifier 100 exhibits improved reverse recovery characteristics. In one embodiment, the Schottky ratio is the ratio of the dimension of the Schottky barrier 185 to the width of the p-well 160.

In addition, construction in a fine process geometry renders doping of p-wells 160 disposed beneath a trench, which is significantly easier in comparison to doping of p-wells beneath larger trenches corresponding to larger process geometries, in one embodiment.

The rectifier structure 100 is now described functionally. A JFET channel forms between the plurality of p-wells 160. In a forward bias condition, the p-wells inject holes into the JFET channel. These additional holes reduce the resistance of the JFET channel, enhancing the forward conduction in the Schottky region of the rectifier structure 100. A Schottky diode between Schottky barrier 185 and n⁻ epitaxy 140 is characterized as having a lower forward drop of about 0.3 volts in comparison with a corresponding PiN diode. When a voltage drop across the JFET channel reaches approximately 0.6 volts, the p-wells starts to inject holes.

The Schottky diode with the metal/semiconductor junction exhibits rectifying behavior (e.g., the current passes through the structure more readily with one polarity than the other). The Schottky diodes of the present embodiment can be used in high frequency and fast switching applications. The Schottky diode operates with majority carriers. The metal region is heavily occupied with conduction band electrons, and the n-type semiconductor region is lightly doped.

The n-channel enhancement regions 150 reduce resistance in the JFET channel thereby delaying onset of a forward bias condition of the p-wells 160. In such a case, a majority of current flows through the JFET channel. Fewer minority carriers results in a decreased density of minority carriers producing beneficial improvements in reverse recovery device performance.

In a reverse bias condition, a depletion region forms around the p-wells 160. Eventually, these depletion regions overlap one another, resulting in "pinch off" of the JFET channel.

Advantageously, characteristics of embodiments in accordance with the present invention are, in large part, controlled by device geometry rather than doping processes. In general, doping processes produce a varying distribution of dopant density, whereas geometric processes are generally more precise.

It is to be appreciated that embodiments in accordance with the present invention are well suited to performance adjustment via a variety of well known techniques, including, for example, minority carrier lifetime reduction, e.g., including electron irradiation, argon, helium or hydrogen implantation, or the diffusion of a heavy metal, for example platinum or gold, singly or in a variety of combinations.

In accordance with another embodiment of the present invention, an ultrafast diode is herein described. The ultrafast diode comprises a substrate. The substrate is doped with a first dopant type, for example, an n-type dopant. The ultrafast diode 100 includes a first epitaxial layer lightly doped with the first dopant type that is coupled to the substrate. The first metallization layer is disposed adjacent to the first epitaxial layer. A first trench is recessed into the first epitaxial layer and is coupled to the metallization layer. A first well is formed beneath and adjacent to the first trench. The first well is doped with a second dopant type, for example, p-type dopant.

In addition, a second trench is recessed in the first epitaxial layer, and is coupled to the metallization layer. A second well is formed beneath and adjacent to the second trench. The second well is doped with the second dopant type, for example, p-type dopant.

A channel region is formed within the first epitaxial layer and is located between the first p-well and the second p-well. The channel region is more highly doped with the first dopant type than the first epitaxial layer In addition, a first oxide layer is formed on walls and a bottom of the first trench such that the first well is electrically isolated from said first trench. Also, a second oxide layer is formed on walls and a bottom of the second trench such that the second well is electrically isolated from the second trench.

Figure 2:
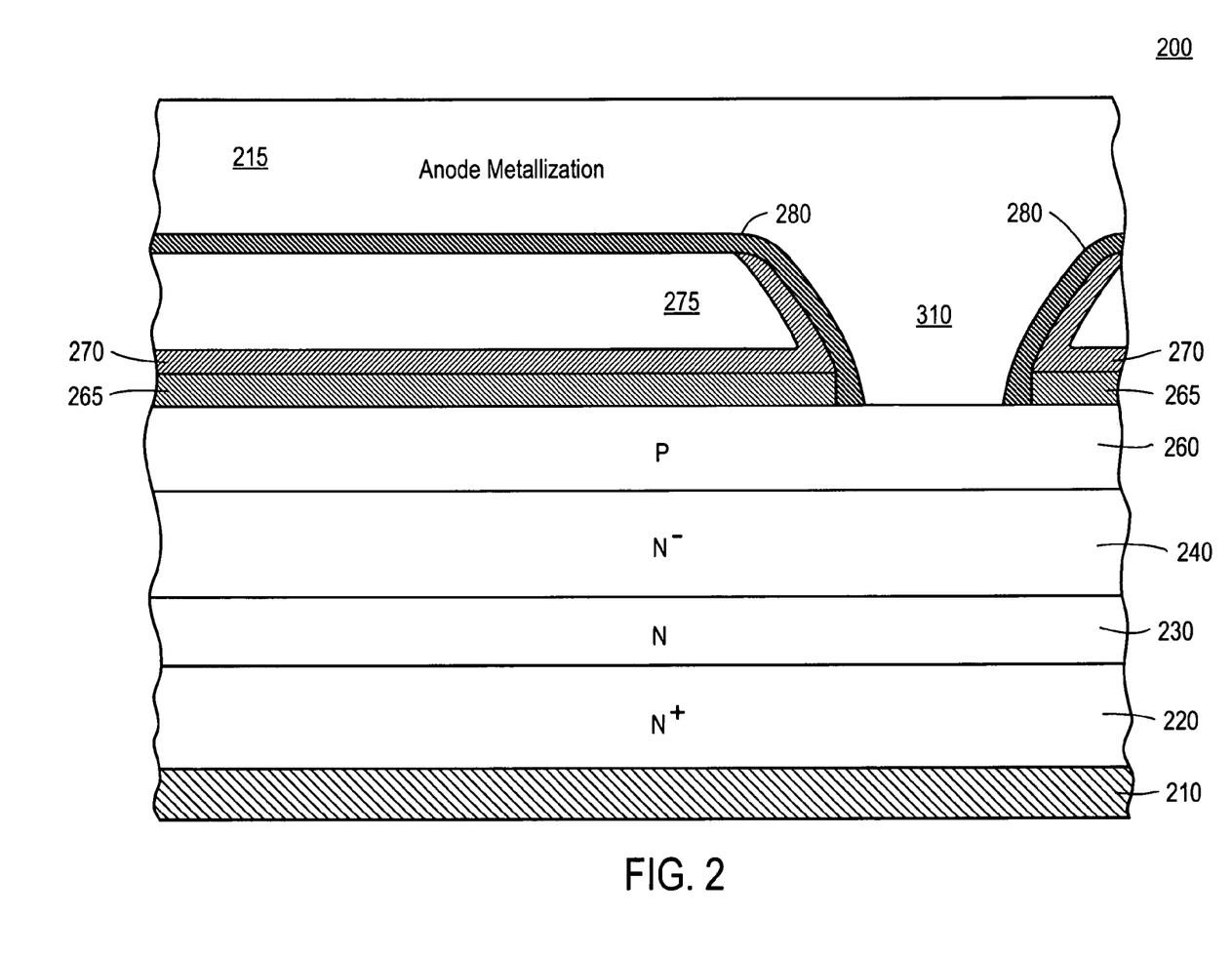
FIG. 2 is a cross section of an ultrafast recovery diode of FIG. 1 taken along a midplane of a p-well, in accordance with one embodiment of the present invention.

FIG. 2 is a cross section of an ultrafast recovery rectifier structure 200 taken along a midplane of a p-well 160 through the trench plug area, in accordance with one embodiment of the present invention. In another embodiment, the rectifier structure 200 is representative of the rectifier 100 of FIG. 1. For example, FIG. 2 is representative of the cross-section of the rectifier structure 100 taken along line A—A of FIG. 1.

As shown in FIG. 2, the ultrafast rectifier structure 200 comprises an n+ substrate 220 that is disposed on a metallization layer (e.g., cathode contact). The ultrafast rectifier structure 200 includes a first epitaxial layer 230 doped with a n-type dopant. The first epitaxial layer 230 acts a depletion layer stop, and is adjacent to the substrate 220. The rectifier structure 200 also includes a second epitaxial layer 240 disposed on top of the first epitaxial layer 230.

As shown in FIG. 2, a cross section of a trench plug area is shown. The trench plug area corresponds to the trench region 175 of FIG. 1. For example, the trench plug area includes the titanium silicide layer 265. An oxide layer 270 is disposed on the bottom and walls of the trench. The trench is filled with undoped polysilicon 275. Also, the trench plug area includes a barrier metal 280 disposed between the trench fill 275 and the anode metallization layer 215.

Also shown in FIG. 2, a p-well 260 is disposed at the bottom of the trench plug area. As shown, the p-well 260 is electrically isolated from the trench region 275, and correspondingly is electrically isolated form the anode metallization layer 215 through the trench plug area.

The p-well region 260 is electrically coupled to the anode metallization 215 through the contact 310. That is, instead of forming a contact through the trench plug area between the p-well 260 and the anode metallization 215, embodiments of the present invention provide for a contact area 310 located remotely from the trench plug area to facilitate electrical coupling between the p-well 260 and the anode metallization layer 215. The contact 310 is created in specially created areas of the device as shown in FIG. 3.

Figure 3:
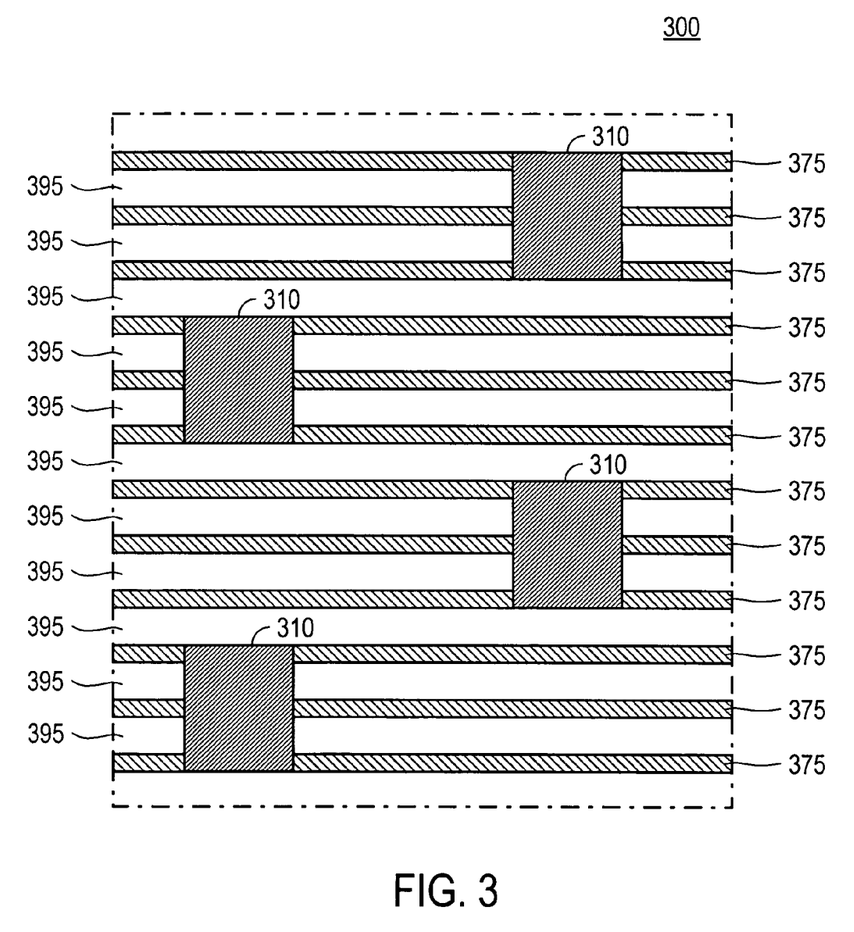
FIG. 3 is a top view of the ultrafast recovery diode, in accordance with one embodiment of the present invention.

FIG. 3 is a top view of the ultrafast recovery rectifier structure 300, in accordance with one embodiment of the present invention. In one embodiment, FIG. 3 is illustrative of the top down view of the rectifier structure 100 of FIG. 1 which exposes the components below the metallization layer (not shown). Also, in another embodiment, FIG. 3 is illustrative of the rectifier structure 200 of FIG. 2.

As shown in FIG. 3, the rectifier structure 300 includes a plurality of trenches 375. A plurality of Schottky diodes 395 is disposed between the plurality of trenches 375. A plurality of p-wells is disposed below the plurality of trenches 375.

As shown in FIG. 3, a plurality of remotely located contact regions 310 are also shown. The contact regions 310 are located remote from the trench plug areas the rectifier structure 300. That is, the p-wells are electrically isolated from the anode metallization layer (not shown) through the trench plug area.

Each of the plurality of contact regions 310 electrically couple the plurality of p-wells and the anode metallization layer (not shown). As such, the p-wells are electrically coupled to the anode metallization layer through the contact region 310.

Figure 4:
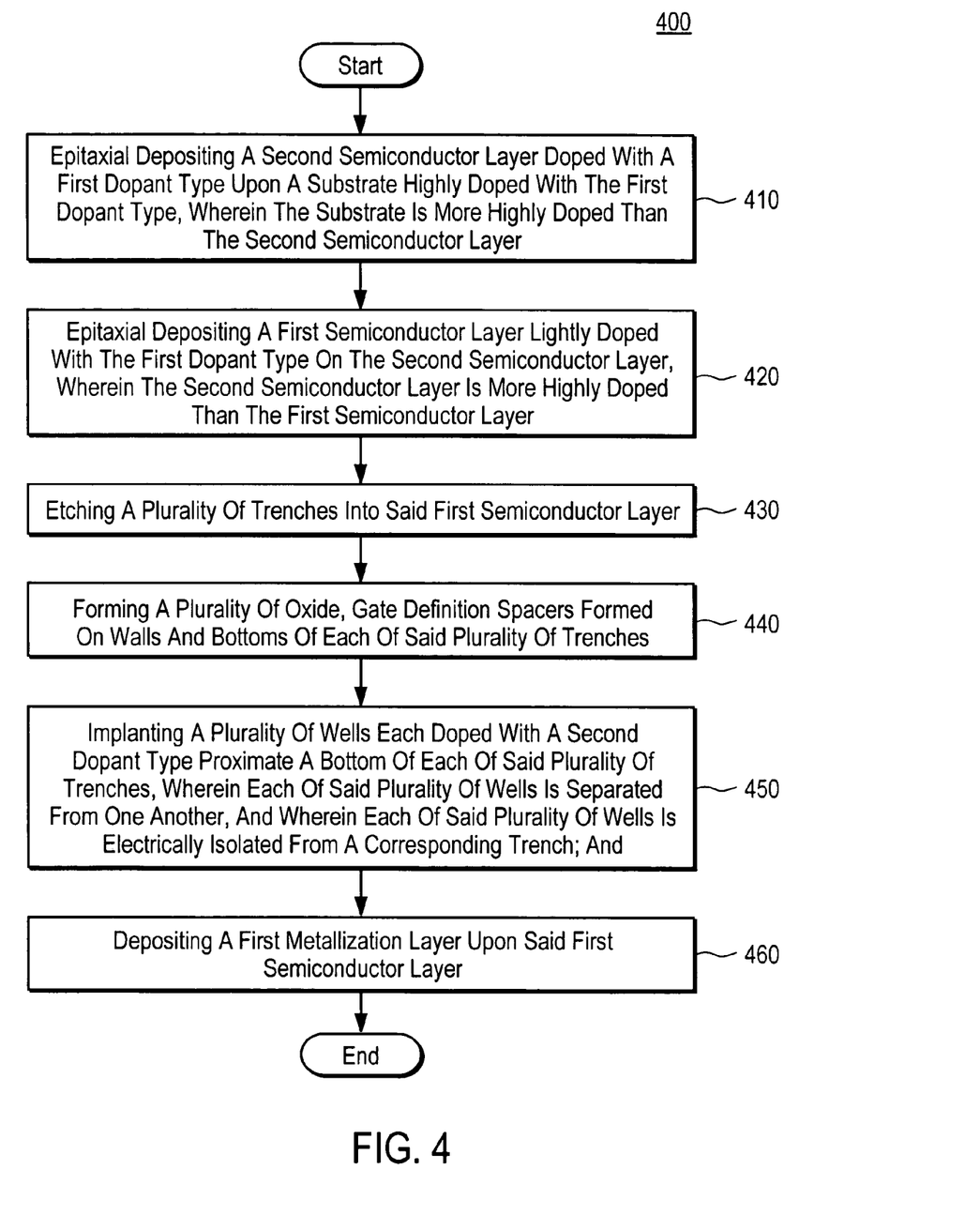
FIG. 4 is a flow chart illustrating steps in a method for fabricating an ultrafast recovery diode with Schottky to PiN ratios more than one, in accordance with one embodiment of the present invention.

FIG. 4 is a flow chart illustrating steps in a method for fabricating an ultrafast recovery rectifier structure with Schottky to PiN ratios equal to or greater than one, in accordance with one embodiment of the present invention. As depicted in FIG. 4, the fabrication process may begin with various initial processes upon a semiconductor substrate such as cleaning, depositing, doping, etching, and/or the like. The semiconductor substrate may contain a first type of dopant at a first concentration. For example, the substrate may comprise silicon heavily doped with phosphorus or arsenic, or silicon heavily doped with boron, in embodiments of the present invention.

At 410, the present embodiment deposits an optional epitaxial layer, a second epitaxial layer, upon the substrate. The second epitaxial layer is doped with the first dopant type. The second epitaxial layer acts as a depletion layer stop. As such, the substrate is more highly doped with the first dopant than the second epitaxial layer.

At 420, the present embodiment deposits another epitaxial layer, a first epitaxial layer, upon the optional, second epitaxial layer. The first epitaxial layer is lightly doped with the first dopant type. The second epitaxial layer is more highly doped than the first epitaxial layer.

In one embodiment, the first epitaxial layer is doped by introducing the dopant into a epitaxial chamber during deposition. For example, the epitaxial deposited first layer may be silicon moderately doped with phosphorous of arsenic (N). The first epitaxial layer may also be doped by an optional high-energy implant and thermal anneal process after deposition. In this case, the epitaxial deposited semiconductor layer may be silicon moderately doped with boron.

At 430, the present embodiment etches a plurality of trenches into the first epitaxial layer. The trenches are substantially parallel and linear. The spacing between the trenches and the depth of the trenches is selected such that a Schottky barrier to PiN ratio is greater or equal to one, thereby increasing the recovery characteristics of the rectifier in reverse bias.

At 440, the present embodiment forms a plurality of oxide layers that are disposed on walls and bottoms of each of the plurality of trenches. As such, the trench fill is isolated from the regions below the trench bottom because of the oxide layers.

At 450, the present embodiment implants a plurality of wells each doped with a second dopant type proximate a bottom of each of the plurality of trenches. In one embodiment, each of the plurality of wells is separated from one another, and wherein each of the plurality of wells is electrically isolated from a corresponding trench by the previously described oxide layers. The plurality of wells forms a grid of control gate regions, as an example. The wells may be implanted by any well-known high-energy implant process. The dopant may be driven to a desired depth with a thermal cycle (e.g., rapid thermal anneal), in one embodiment.

In addition, the present embodiment forms a plurality of remotely located contact regions that electrically couple the plurality of wells and the first metallization layer.

In one embodiment, a plurality of channel regions between the wells is implanted with the first dopant type to form an enhanced channel region. That is, regions in the first semiconductor layer in a plurality of channel regions defined between the plurality of wells are implanted with the first dopant. As such, the plurality of channel regions is more highly doped than said first epitaxial layer.

At 460, the present embodiment deposits a first metallization layer upon the first epitaxial layer. For instance, the first metallization layer is the anode metallization layer.

Also, in another embodiment, a Schottky barrier metal is disposed under the first metallization layer, such that the Schottky barrier separates said first metallization layer and the first epitaxial layer. In particular, Schottky barrier diodes are formed between the Schottky barrier metal and the first epitaxial layer above the channel regions previously described.

Figure 5:
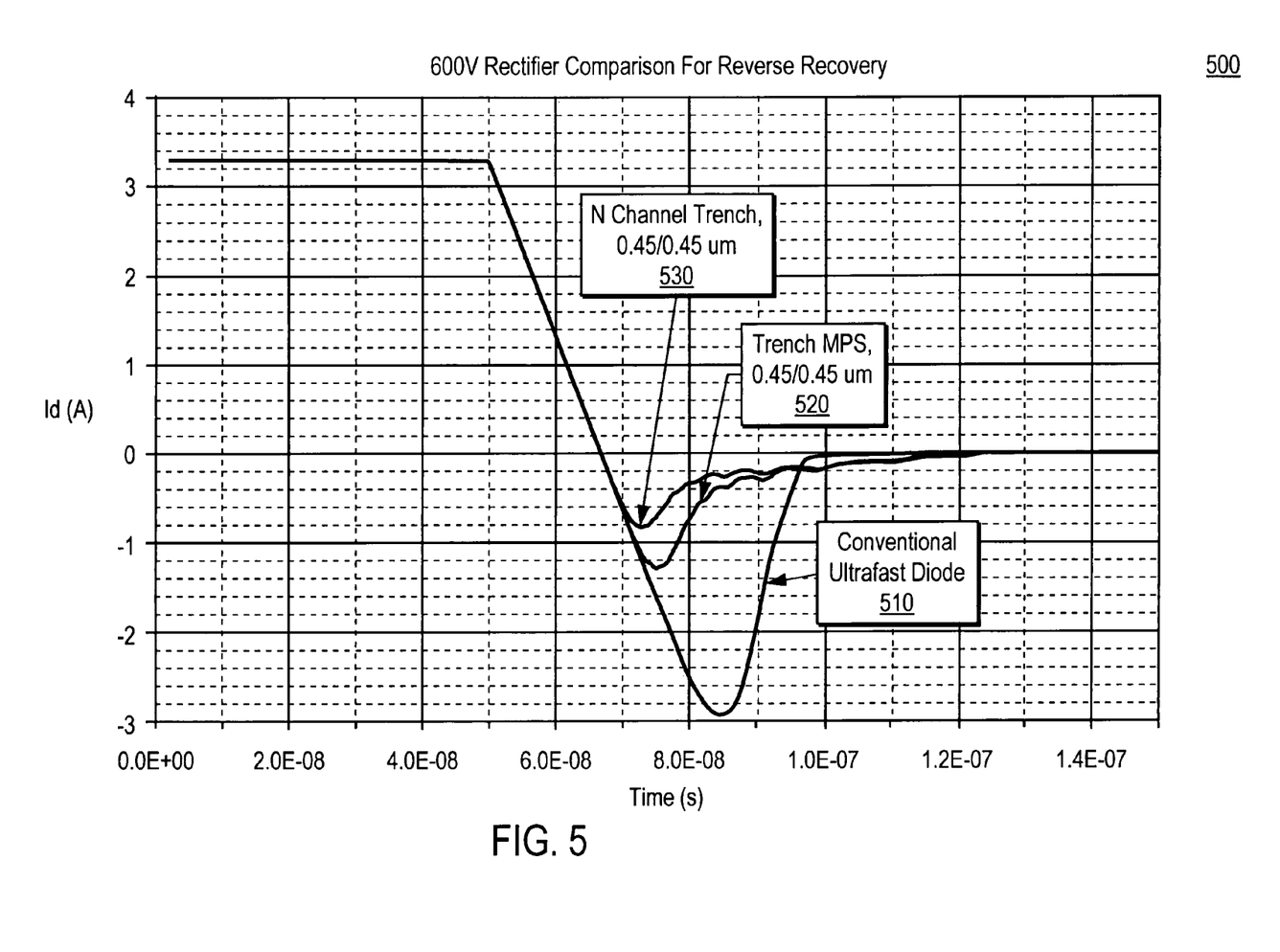
FIG. 5 is a chart illustrating exemplary current versus time recovery characteristics, in accordance with one embodiment of the present invention.

FIG. 5 illustrates exemplary current versus time recovery characteristics 500, in accordance with embodiments of the present invention. Recovery characteristic 510 represents reverse recovery characteristics of an exemplary 600 volt ultrafast diode as known in the conventional art. It is appreciated that the recovery characteristic comprises about three amperes of maximum reverse current and a duration of about 3×10 seconds.

Recovery characteristic 520 represents reverse recovery characteristics of an exemplary 600 volt diode, in accordance with embodiments of the present invention. It is to be appreciated that the recovery characteristic of this diode comprises significantly less current than the conventional diode of characteristic 510. Recovery characteristic 520 shows a maximum reverse current of about 1.3 amps. Beneficially, the recovery duration is somewhat longer in duration than that of characteristic 510, e.g., about 4.5×108 seconds.

Recovery characteristic 530 represents reverse recovery characteristics of a second exemplary 600 volt diode, in accordance with embodiments of the present invention. It is to be appreciated that the recovery characteristic of this diode comprises significantly less current than the conventional diode of characteristic 510. Recovery characteristic 520 shows a maximum reverse current of about 0.8 amps. Beneficially, the recovery duration is somewhat longer in duration than that of characteristic 510, e.g., about 4.5×108 seconds.

Accordingly, various embodiments of the present invention disclose an apparatus and method for a fast recovery rectifier structure. Embodiments of the present invention are able to reduce the reverse recovery charge while maintaining a soft recovery characteristic. Also, embodiments of the present invention disclose a silicon based fast recovery diode involving the creation of Schottky diode regions in series with JFET channel regions, or a merged PiN Schottky (MPS) diode structure. The MPS diode structure enables a higher Schottky to PiN ratio because of smaller geometries, and reduced channel resistance due to N doping between the well regions that reduce the contribution of hole injection during forward conduction, for example in one embodiment.

While the methods of embodiments illustrated in flow chart 400 show specific sequences and quantity of steps, the present invention is suitable to alternative embodiments. For example, not all the steps provided for in the methods are required for the present invention. Furthermore, additional steps can be added to the steps presented in the present embodiment. Likewise, the sequences of steps can be modified depending upon the application.

Embodiments of the present invention, a fast recovery rectifier structure having Schottky to PiN ratios approximately greater than or equal to one, and a method of fabricating the same are thus described. While the present invention has been described in particular embodiments, it should be appreciated that the present invention should not be construed as limited by such embodiments, but rather construed according to the below claims.

What is claimed is:

1. A rectifier device, comprising
   a substrate, wherein said substrate is doped with a first dopant type;
   a first epitaxial layer doped with said first dopant type coupled to said substrate;
   a first metallization layer adjacent to said first epitaxial layer;
   a plurality of trenches recessed into said first epitaxial layer, wherein each of said plurality of trenches includes a conductive material coupled to said metallization layer;
   a plurality of wells each doped with a second dopant type, wherein each of said plurality of wells is separated from one another, and wherein each of said plurality of wells is formed beneath a corresponding trench in said plurality of trenches;
   a conductive layer disposed between each of the plurality of wells and the corresponding trench;
   a plurality of oxide layers, each of which is formed on walls and a bottom of a corresponding trench such that a corresponding well is electrically isolated from said conductive material within said corresponding trench; and
   a plurality of channel regions doped with said first dopant type formed within said first epitaxial layer, wherein each of said plurality of channel regions is located between two corresponding wells from said plurality of wells, and wherein each of said plurality of channel regions is more highly doped with said first dopant type than said first epitaxial layer.

2. The rectifier device of claim 1, further comprising:
   a second epitaxial layer located between said substrate said first epitaxial layer, wherein said second epitaxial layer is less highly doped than said substrate, and more highly doped than said first epitaxial layer.

3. The rectifier device of claim 1, further comprising:
   a Schottky barrier disposed under said first metallization layer, such that said Schottky barrier separates said first metallization layer and said first epitaxial layer.

4. The rectifier device of claim 3, further comprising:
   a plurality of PiN areas, wherein a ratio of area of said Schottky barrier to each of said plurality of PiN areas is approximately greater than or equal to one.

5. The rectifier device of claim 1, wherein each of said plurality of trenches comprises undoped silicon.

6. The rectifier device of claim 1, wherein said first dopant type comprises an n-type dopant.

7. The rectifier device of claim 1, further comprising:
   a plurality of remotely located contact regions coupled to said plurality of wells and said first metallization layer, wherein each of the remotely located contact regions is configured to couple a respective subset of the plurality of wells and the first metallization layer.

8. The rectifier device of claim 1, wherein the conductive layer is a titanium silicide (TiSi2) layer.

9. An ultrafast diode, comprising:
   a substrate, wherein said substrate is doped with a first dopant type;
   a first epitaxial layer lightly doped with said first dopant type coupled to said substrate;
   a first metallization layer adjacent to said first epitaxial layer;
   a first trench recessed into said first epitaxial layer and including a first conductive material coupled to said metallization layer;
   a first well doped with a second dopant type formed beneath said first trench;
   a second trench recessed into said first epitaxial layer and including a second conductive material coupled to said metallization layer;
   a second well doped with said second dopant type formed beneath said second trench;
   a conductive layer disposed between each of the first and second wells and the corresponding trench; and
   a channel region formed within said first epitaxial layer and located between said first well and said second well, wherein said channel region is more highly doped with said first dopant type than said first epitaxial layer.

10. The ultrafast diode of claim 9, further comprising:

a first oxide layer formed on walls and a bottom of said first trench such that said first well is electrically isolated from said first conductive material within said first trench; and a second oxide layer formed on walls and a bottom of said second trench such that said second well is electrically isolated from said second conductive material within said second trench.

11. The ultrafast diode of claim 9, further comprising:

a second metallization layer adjacent to said substrate.

12. The ultrafast diode of claim 9, wherein said first dopant type comprises an n-type dopant.

13. The ultrafast diode of claim 9, further comprising:

a second epitaxial layer of said first dopant type located between said substrate and said first epitaxial layer, wherein said substrate is more highly doped than said second epitaxial layer, and wherein said second epitaxial layer is more highly doped than said first epitaxial layer, and wherein said substrate is doped with said first dopant type.

14. The ultrafast diode of claim 9, further comprising:

at least one remotely located contact region coupled to said first well, said second well, and said first metallization layer.

15. The ultrafast diode of claim 9, further comprising:

a Schottky barrier located between said first metallization layer and said first semiconductor layer.

16. The ultrafast diode of claim 15, further comprising:

a PiN area, wherein a ratio of area of said Schottky barrier to said PiN area is approximately greater than or equal to one.

17. The ultrafast diode of claim 9, wherein the conductive layer is a titanium silicide (TiSi2) layer.

* * * * *